(12) United States Patent
Ding et al.

(10) Patent No.: US 8,112,878 B1
(45) Date of Patent: Feb. 14, 2012

(54) ASSEMBLY AUXILIARY JIG

(75) Inventors: Xiaopeng Ding, Jiangsu Province (CN);
Xiang Gu, Jiangsu Province (CN);
Ching-Feng Hsieh, Taipei (TW)

(73) Assignee: Askey Computer Corp. (TW)

( * ) Notice: Subject to any disclaimer, the term of this patent is extended or adjusted under 35 U.S.C. 154(b) by 0 days.

(21) Appl. No.: 12/976,119

(22) Filed: Dec. 22, 2010

(30) Foreign Application Priority Data

Nov. 30, 2010 (TW) .............................. 99223189 U

(51) Int. Cl.
*B23P 19/04* (2006.01)
(52) U.S. Cl. ........... 29/760; 269/287; 269/319; 269/903
(58) Field of Classification Search .................. 29/760, 29/428, 281.1; 269/903, 287, 288, 319
See application file for complete search history.

(56) References Cited

U.S. PATENT DOCUMENTS

| | | | | |
|---|---|---|---|---|
| 2,760,547 A | * | 8/1956 | Dempnock, Jr. ............... | 156/564 |
| 4,623,156 A | * | 11/1986 | Moisson et al. .............. | 279/106 |
| 6,003,851 A | * | 12/1999 | Araki et al. ................... | 269/239 |
| 6,112,795 A | * | 9/2000 | Emmett et al. ................ | 156/556 |

* cited by examiner

*Primary Examiner* — Livius R Cazan
(74) *Attorney, Agent, or Firm* — Schmeiser, Olsen & Watts, LLP

(57) ABSTRACT

An assembly auxiliary jig facilitates assembly of an electronic device having a casing, a first fitting, a second fitting, and a wire. The assembly auxiliary jig includes: a base having therein a receiving space for positioning and receiving the casing and an accessing recess configured to communicate with the receiving space and facilitate access to the casing; a first platform disposed at the base and having a positioning groove in communication with the receiving space to thereby receive the first fitting; a first lid hinged to the first platform and configured to close the positioning groove; a second platform disposed at the base and defined with a positioning recess in communication with the receiving space to receive the second fitting; and a second lid hinged to the second platform and configured to close the positioning recess.

9 Claims, 7 Drawing Sheets

ASSEMBLY AUXILIARY JIG

CROSS-REFERENCE TO RELATED APPLICATION

This non-provisional application claims priority under 35 U.S.C. §119(a) on Patent Application No(s). 099223189 filed in Taiwan, R.O.C. on Nov. 30, 2010, the entire contents of which are hereby incorporated by reference.

FIELD OF THE TECHNOLOGY

The present invention relates to assembly auxiliary jigs, and more particularly, to an assembly auxiliary jig for facilitating assembly of a casing and parts/components of an electronic device.

BACKGROUND

Development of technology-based industries leads to the trend toward diversification of electronic products. Hence, the daily life of human beings nowadays features the use of a wide variety of consumer electronic products, such as mobile electronic devices and wireless electronic devices. The aforesaid mobile electronic devices include mobile phones, multimedia players, portable storage device, etc. The aforesaid wireless electronic devices include wireless Internet cards, wireless chargers, etc. The manufacturing of the aforesaid electronic products entails installing parts and components in the aforesaid electronic products, connecting the parts and components electrically, laminating or packaging the casing of the aforesaid electronic products so as to enhance the durability thereof.

For example, a wireless access point (WAP), whose assembly process is described hereunder, comprises parts and components, such as a casing (composed of an upper casing and a lower casing), a metal leaf spring, a printed circuit board, a wire, wire connection clamps, an antenna, and support stands, etc. The conventional assembly process of a WAP is mostly manually performed, using a production line, by following a process flow comprising the steps of: installing a metal leaf spring, a printed circuit board, and a wire; fixing the antenna to the lower casing by engagement between the antenna and related notches disposed on the lower casing; electrically connecting the antenna to the printed circuit board; tidying up the wire and fixing the wire in place with a wire connection clamp; fixing support stands to the lower casing by engagement between the support stands and related notches disposed on the lower casing; and putting the upper casing on the lower casing to hermetically seal the WAP and thereby finalize the assembly process. Finally, the assembled WAP (i.e., the finished product) undergoes a packaging procedure whereby the upper casing and the lower casing are tightly coupled together by ultrasonic lamination.

The aforesaid conventional assembly process has drawbacks as follows:
  installing a large number of small parts and components within a crowded space inside a device is so difficult that, at the end of the installation process, some of the parts and components may be missing or unsecured;
  otherwise fastened parts and components may get loosened while leaving one operating point for another one on the same production line during the semi-finished product phase that precedes the packaging phase;
  a likely product defect, that is, scratches and abrasions occur to a casing unduly moved, rubbed, and handled;
  purposely uneven profile of a device or a bump or any other protruding component disposed on the casing prevents the casing from lying flatly and stably and thereby compromises the ease of assembly, for example, to a particularly great extent during the step of putting the upper casing on the lower casing for hermetic sealing, wherein, given a curved profile and shape of a wire, an antenna, support stands, and the lower casing, the casing does not lie stably and flatly to the detriment of the engagement between the upper casing and the lower casing, and a force unduly exerted upon the upper casing and the lower casing in the course of engagement therebetween eventually loosens or damages the parts and components; and
  the assembly process is so intricate that it cannot be performed solely by a single worker and finished once and for all, and in consequence the productivity of the assembly process is low.

Accordingly, the conventional assembly process is difficult, time-consuming, and susceptible to omission, and cannot be finalized once and for all, thereby resulting in a low conforming rate and deterioration of productivity.

SUMMARY

It is an objective of the present invention to provide an assembly auxiliary jig for facilitating assembly of an electronic device, simplifying an assembly operation, so as to enable a worker to perform an assembly process correctly, quickly, and conveniently and enhance the conforming rate and yield of products.

In order to achieve the above and other objectives, the present invention provides an assembly auxiliary jig for facilitating assembly of an electronic device having a casing, a first fitting, a second fitting, and a wire, the assembly auxiliary jig comprising: a base having therein a receiving space for positioning and receiving the casing and an accessing recess configured to communicate with the receiving space and facilitate access to the casing; a first platform disposed at the base and having a positioning groove in communication with the receiving space, wherein the positioning groove is configured to receive an exposed portion of the first fitting after the first fitting is disposed at the casing; a first lid hinged to the first platform and configured to close the positioning groove so as to ensure an assembly status of the first fitting; a second platform disposed at the base and defined with a positioning recess in communication with the receiving space, wherein the positioning recess is configured to receive an exposed portion of the second fitting after the second fitting is disposed at the casing; and a second lid hinged to the second platform and configured to close the positioning recess so as to ensure an assembly status of the second fitting.

The first lid of the assembly auxiliary jig further comprises a securing groove corresponding in position to the positioning groove, such that the securing groove and the positioning groove together receive the first fitting as soon as the first lid closes the positioning groove.

The second lid of the assembly auxiliary jig further comprises a stopping block corresponding in position to the positioning recess, such that the stopping block abuts against the second fitting as soon as the second lid closes the positioning recess.

As regards the assembly auxiliary jig, an engaging slit extends from and communicates with the receiving space of the base, such that the wire of the electronic device is fixed in place by means of the engaging slit. The accessing recesses of the base are disposed on two sides of the receiving space, respectively.

Magnets adhere to the second platform and the second lid, respectively, such that the positioning recess is hermetically sealed by shutting the second lid against the second platform. The second lid comprises a handle for use in operating the second lid to close the positioning recess.

The base, the first platform, and the second platform of the assembly auxiliary jig are integrally formed as a unitary structure.

The assembly auxiliary jig further comprises a protective pad which is disposed on specific surfaces of assembly auxiliary jig to protect the surfaces of the electronic device, wherein, through the specific surfaces of the assembly auxiliary jig, the assembly auxiliary jig is in contact with the aforesaid parts and components of the electronic device. The aforesaid specific surfaces of the assembly auxiliary jig include the surfaces of the receiving space of the base, the positioning groove of the first platform, the first lid, the securing groove of the first lid, the second lid, and two said stopping blocks of the second lid.

Hence, the assembly auxiliary jig of the present invention facilitates a firm grip of parts and components during operation thereof, precludes omission of parts and components, and prevents parts and components from loosening during the assembly process. Furthermore, the assembly auxiliary jig of the present invention has a protective pad for protecting the surfaces of the electronic device during an assembly process thereof. Thus, compared with a conventional means of assembly, the assembly auxiliary jig of the present invention is quicker, more precise, and more convenient, enables an assembly process to be performed and finalized once and for all and in a "one worker one piece" manner, simplifies the operation of an assembly production line, and eventually enhances the conforming rate, quality, and yield of products.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION

Figure 1:
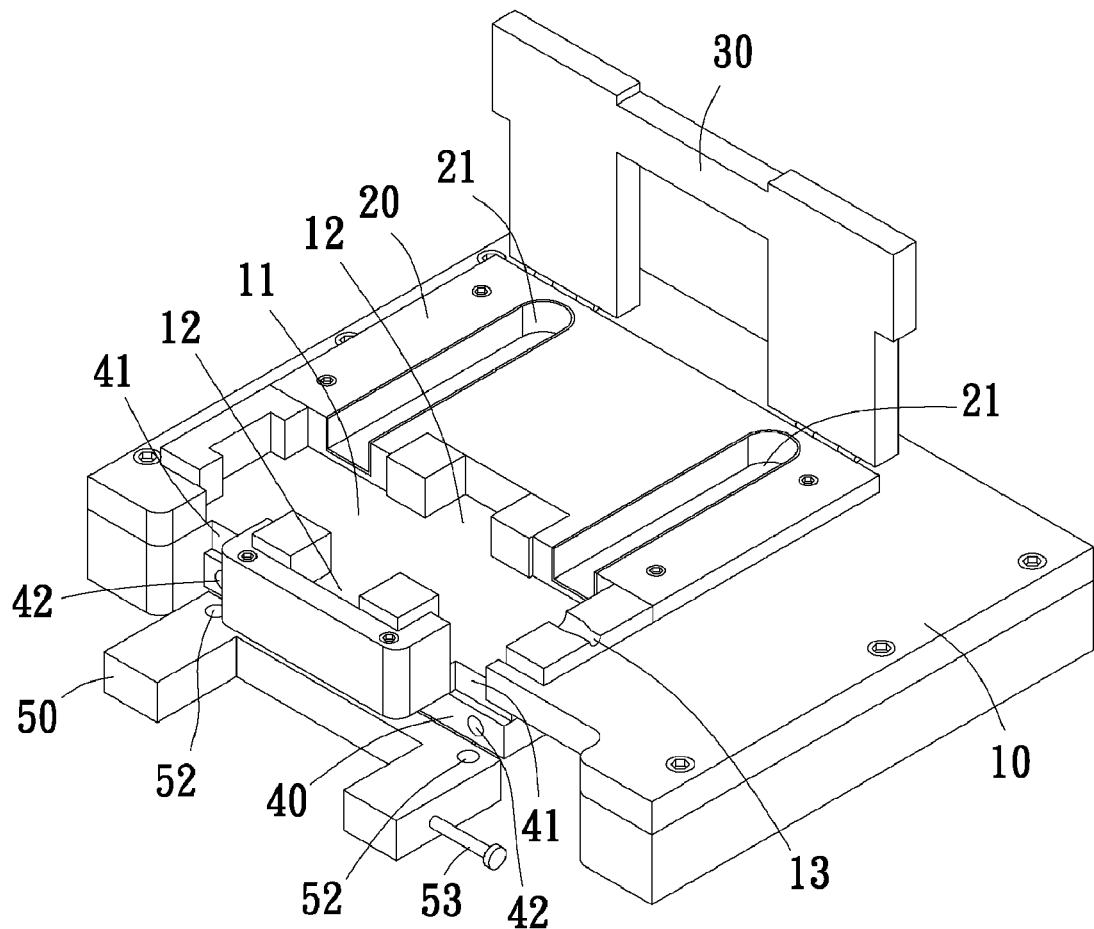
FIG. 1 is a perspective view of an assembly auxiliary jig according to a first embodiment of the present invention.

Referring to FIG. 1, there is shown a perspective view of an assembly auxiliary jig 1 according to a first embodiment of the present invention. The assembly auxiliary jig 1 facilitates assembly of an electronic device. The electronic device has a casing. A first fitting, a second fitting, and a wire, all of which are integral elements of the electronic device, are exposed from the electronic device. The assembly auxiliary jig 1 comprises a base 10, a first platform 20, a first lid 30, a second platform 40, and a second lid 50. The base 10 has therein a receiving space 11 and an accessing recess 12. The receiving space 11 is configured to position and receive the casing of the electronic device. The accessing recess 12 is configured to communicate with the receiving space 11 and facilitate access to the casing. The first platform 20 is disposed at the base 10 and has a positioning groove 21 in communication with the receiving space 11. The positioning groove 21 is configured to receive an exposed portion of the first fitting after the first fitting is disposed at the casing. The first lid 30 is hinged to the first platform 20 and configured to close the positioning groove 21 so as to ensure the assembly status of the first fitting. The second platform 40 is disposed at the base 10 and defined with a positioning recess 41 in communication with the receiving space 11. The positioning recess 41 is configured to receive an exposed portion of the second fitting after the second fitting is disposed at the casing. The second lid 50 is hinged to the second platform 40 and configured to close the positioning recess 41 so as to ensure the assembly status of the second fitting. An engaging slit 13 extends from and communicates with the receiving space 11, such that the wire of the electronic device is fixed in place by means of the engaging slit 13. Magnets 42, 52 adhere to the second platform 40 and the second lid 50, respectively, ensure the hermetical sealing of the positioning recess 41 by enabling the second lid 50 and the second platform 40 to be attracted to each other, and prevent the second platform 40 and the second lid 50 from loosening during an assembly operation, so as to ensure that products can be correctly assembled. The second lid 50 further comprises a handle 53 for use in operating the second lid 50 to close the positioning recess 41 and thus enhance ease of use of the assembly auxiliary jig 1.

Figure 2:
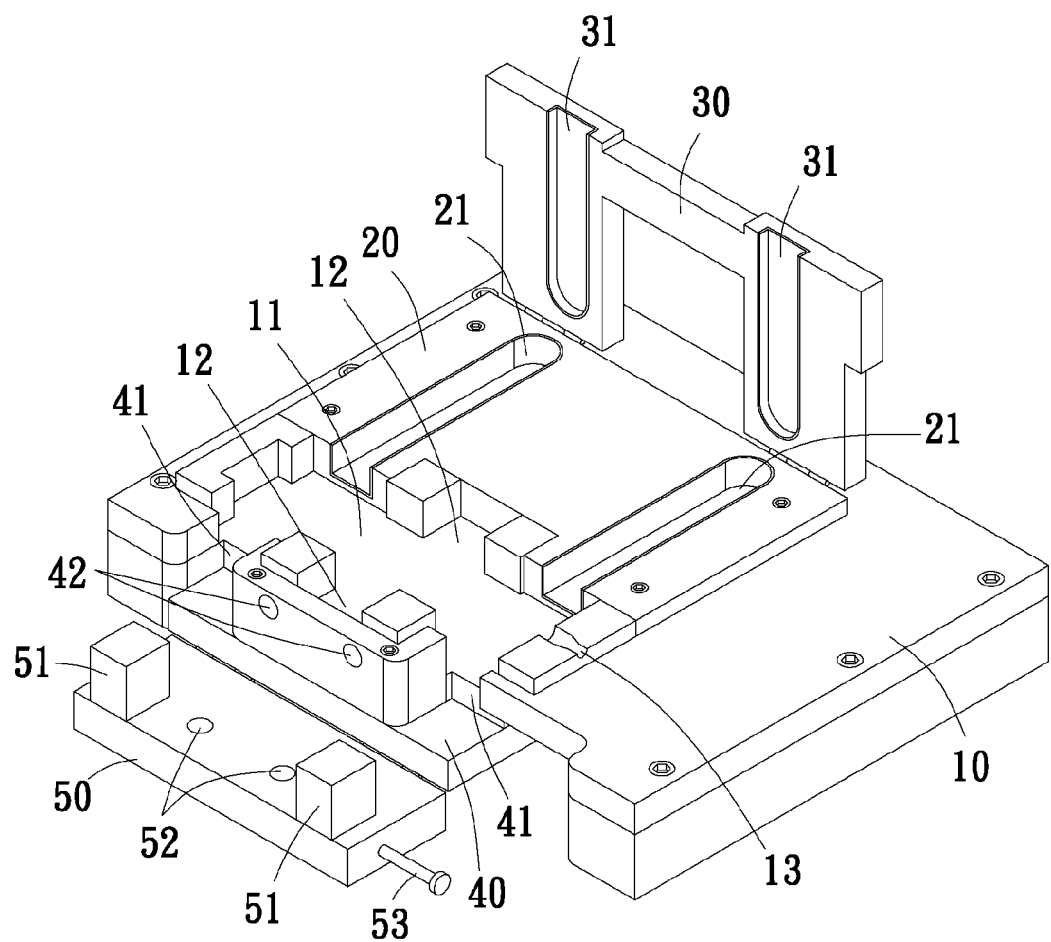
FIG. 2 is a perspective view of the assembly auxiliary jig according to a second embodiment of the present invention.

FIG. 2 is a perspective view of an assembly auxiliary jig 2 according to a second embodiment of the present invention. The assembly auxiliary jig 2 results from modification of the assembly auxiliary jig 1 of the first embodiment. The first lid 30 of the assembly auxiliary jig 2 further comprises a securing groove 31 of dimensions and shape correlated to that of the first fitting. The securing groove 31 of the first lid 30 corresponds in position to the positioning groove 21 of the first platform 20. The securing groove 31 and the positioning groove 21 together receive the first fitting as soon as the first lid 30 closes the positioning groove 21; hence, the first fitting is fixed in place during the assembly process. The second lid 50 of the assembly auxiliary jig 2 further comprises a stopping block 51 of dimensions and shape correlated to that of the second fitting. The stopping block 51 of the second lid 50 corresponds in position to the positioning recess 41 of the second platform 40. The stopping block 51 abuts against the second fitting as soon as the second lid 50 closes the positioning recess 41, so as to ensure the assembly status of the second fitting.

FIGS. 3 through 6 are schematic views of the assembly auxiliary jig 2 for use in an assembly process of an electronic device according to the second embodiment of the present invention. The electronic device has the casing. The first fitting, the second fitting, and the wire, all of which are integral elements of the electronic device, are exposed from the electronic device. The first fitting and the second fitting are installed in the casing by engagement, screwing, or pivotal connection and are exposed from the electronic device. In this embodiment, the electronic device is a double-antenna wireless access point (WAP) which comprises a casing 110 (comprising an upper casing 111 and a lower casing 112), a metal leaf spring 120, a printed circuit board 130, a wire 140, an antenna 150, a wire connection clamp 160, and support stands 170. In this embodiment, the first fitting corresponds in position to two said antennas 150 of the WAP, and the second fitting corresponds in position to two said support stands 170 of the WAP. The metal leaf spring 120, the printed circuit board 130, and the wire connection clamp 160 are disposed inside the casing 110 of the WAP. One end of the wire 140 is inserted into the casing 110 of the WAP. The wire 140 is configured to electrically connect the WAP to another electronic device.

Figure 3:
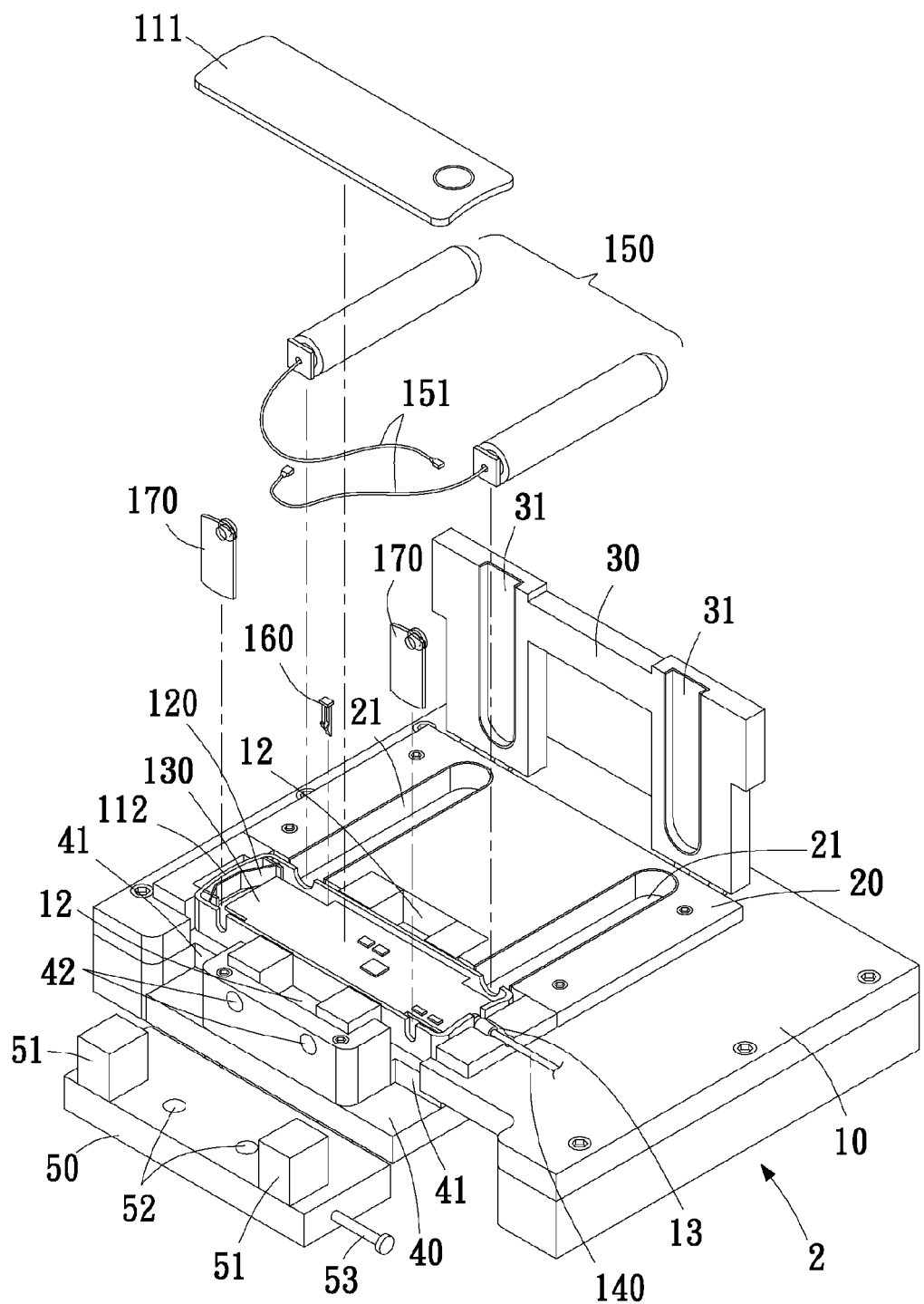
FIGS. 3 through 6 are schematic views of the assembly auxiliary jig for use in an assembly process of an electronic device according to the second embodiment of the present invention.

Referring to FIG. 3, the assembly auxiliary jig 2 is for use in facilitating assembly of an electronic device, and the receiving space 11 in the base 10 is configured to fix the lower casing 112 in place and thereby enable parts and components to be installed in sequence. The receiving space 11 is in communication with two said accessing recesses 12 which are disposed on two sides of the receiving space 11, respectively, to facilitate access to the casing. The assembly auxiliary jig-based assembly process of the electronic device comprises the steps of: installing the metal leaf spring 120, the printed circuit board 130, and the wire 140 inside the lower casing 112 in a manner that the wire 140 is fixed to the engaging slit 13; receiving two said antennas 150 in two said positioning grooves 21, respectively; attaching two said antennas 150 to the lower casing 112 by engagement with notches thereof; electrically connecting two said antennas 150 to the printed circuit board 130 through wires 151; tidying up the wires 151 and fixing the wires 151 in place by the wire connection clamp 160; aligning two said support stands 170 with two said positioning recesses 41, respectively; and attaching two said support stands 170 to the lower casing 112 by engagement with the notches thereof.

Figure 4:
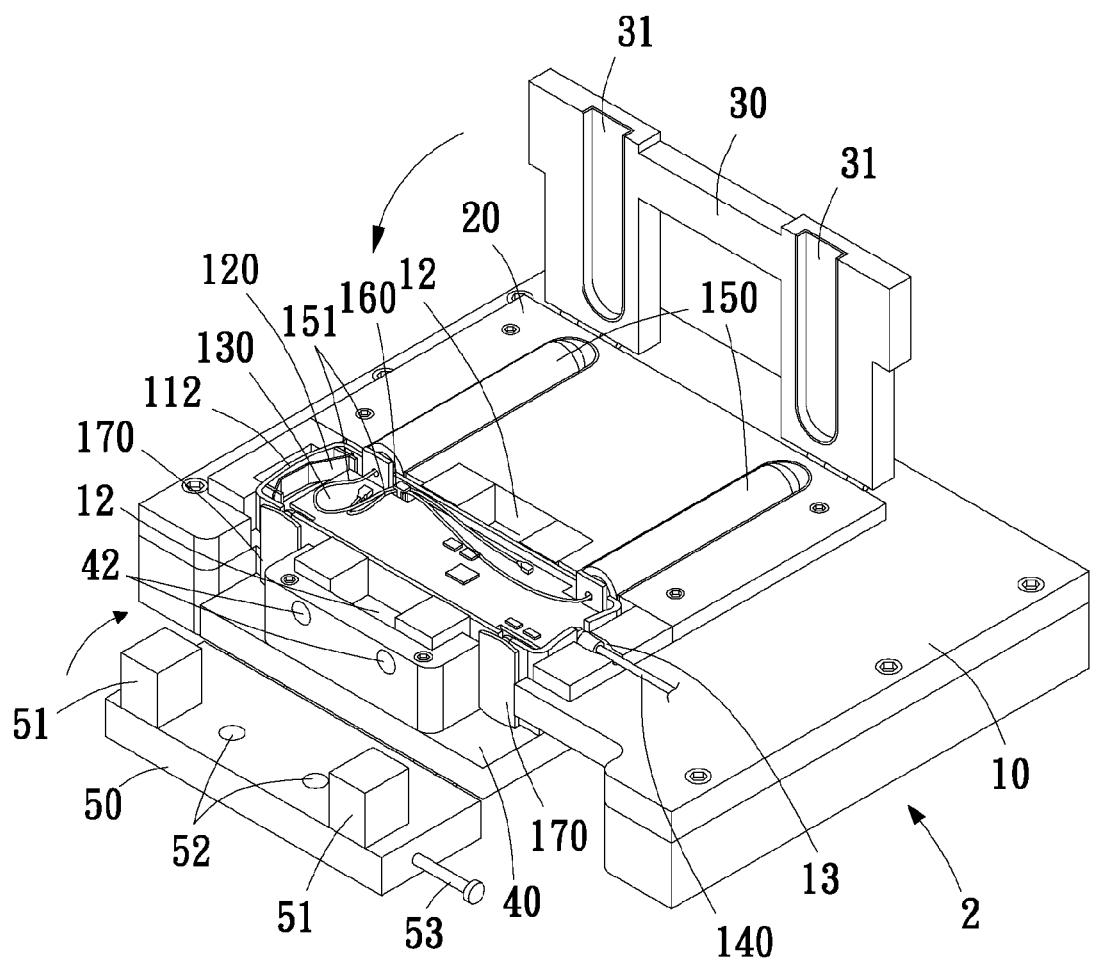

Referring to FIG. 4, after the aforesaid internal parts and components have been installed in the lower casing 112, the assembly worker places the first lid 30 on the first platform 20 such that the first lid 30 closes the positioning grooves 21 and allows the securing grooves 31 and the positioning grooves 21 to jointly receive the antenna 150 so as to ensure the assembly status of the antenna 150, and the assembly worker places the second lid 50 on the second platform 40 such that the second lid 50 closes the positioning recesses 41 and allows the stopping blocks 51, which correspond in position to the positioning recesses 41, respectively, to abut against and bolster the support stands 170 so as to ensure the assembly status of the support stands 170.

Magnets 42, 52 adhere to the second platform 40 and the second lid 50, respectively, ensure the hermetical sealing of the positioning recess 41 by enabling the second lid 50 and the second platform 40 to be attracted to each other, and prevent the second platform 40 and the second lid 50 from loosening during an assembly operation, so as to ensure that products can be correctly assembled. The second lid 50 further comprises the handle 53 for use in operating the second lid 50 to close the positioning recess 41 and thus enhance ease of use of the assembly auxiliary jig 2.

Figure 5:
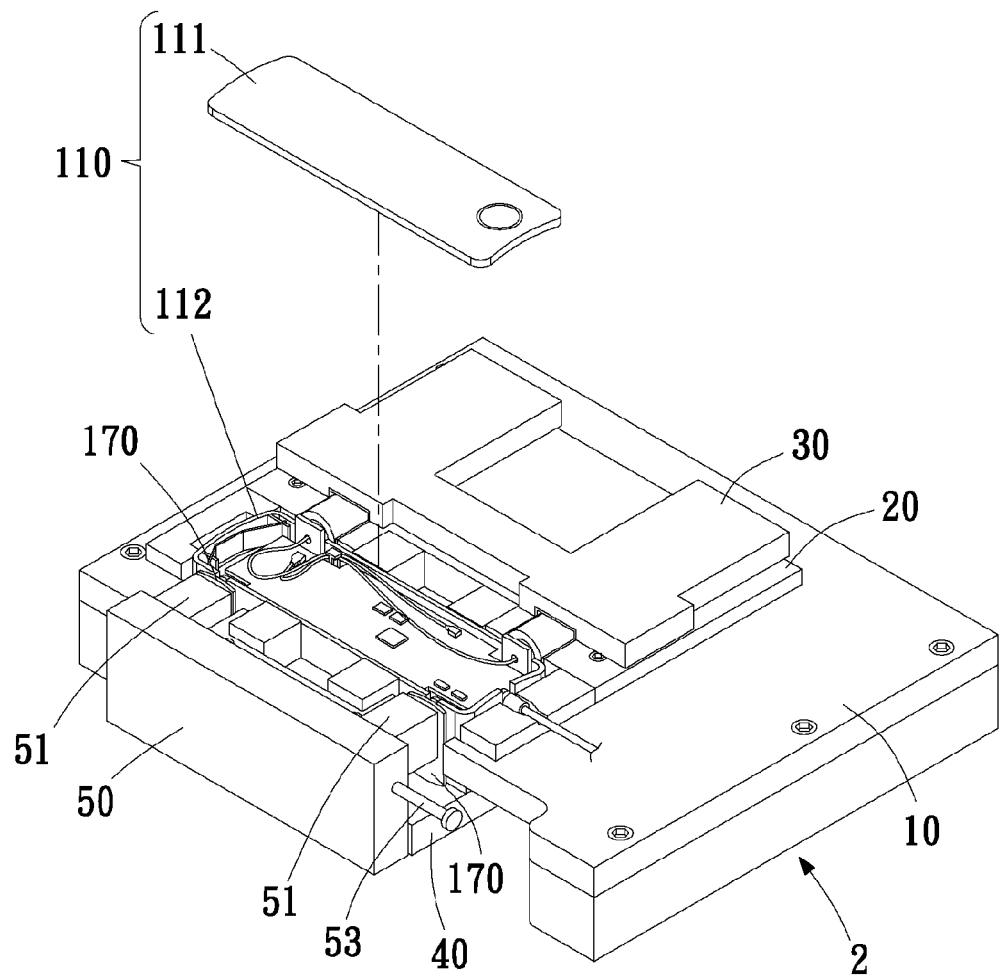
Figure 6:
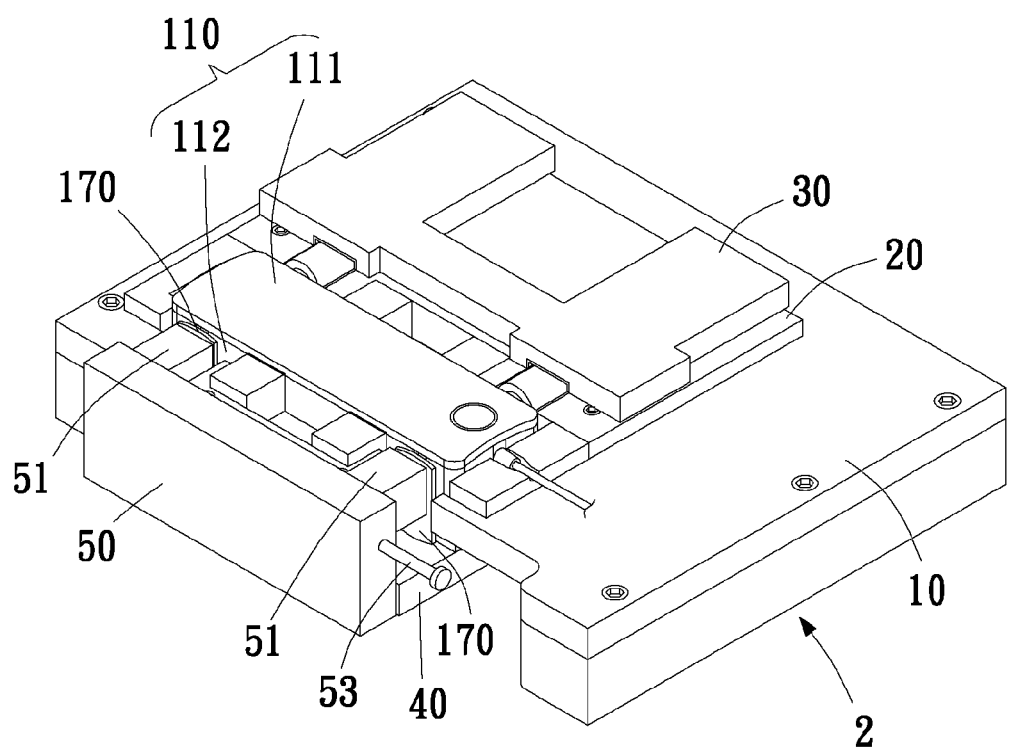

Referring to FIG. 5, after the first lid 30 and the second lid 50 have been shut, the assembly worker places the upper casing 111 of the electronic device on the lower casing 112 to finalize the assembly of the electronic device, as shown in FIG. 6. Finally, the electronic device thus assembled is removed from the assembly auxiliary jig 2 to undergo the packaging procedure of the ultrasonic lamination operation so as for the casing 110 to be hermetically sealed.

Figure 7:
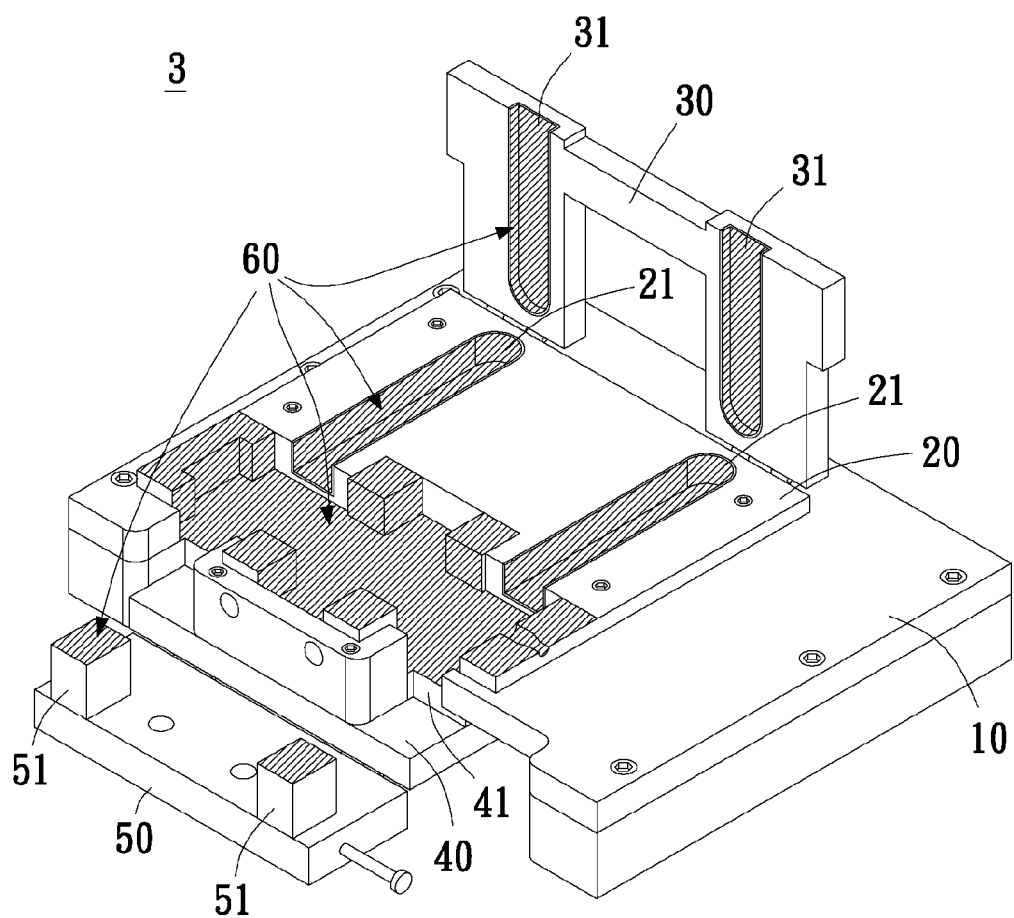
FIG. 7 is a perspective view of the assembly auxiliary jig according to a third embodiment of the present invention.

FIG. 7 is a perspective view of an assembly auxiliary jig 3 according to a third embodiment of the present invention. The assembly auxiliary jig 3 results from modification of the assembly auxiliary jigs 1, 2 of the aforesaid embodiments, respectively. In the third embodiment, the assembly auxiliary jig 3 further comprises a protective pad 60 which is disposed on specific surfaces of assembly auxiliary jig 3, wherein, through the specific surfaces of the assembly auxiliary jig 3, the assembly auxiliary jig 3 is in contact with the aforesaid parts and components of the electronic device. The aforesaid specific surfaces of the assembly auxiliary jig 3 include the surfaces of the receiving space 11 of the base 10, the positioning groove 21 of the first platform 20, the first lid 30 (in the first embodiment), the securing groove 31 of the first lid 30, the second lid 50 (in first embodiment), and two said stopping blocks 51 of the second lid 50, as indicated by the hatched area shown in FIG. 7. The protective pad 60 serves to protect the electronic device against collision, friction, or any external force, during the assembly process, such that the electronic device is free of abrasions and scratches. The protective pad 60 is made of flannelette, cork, or rubber, and is preferably of a low coefficient of friction and thus renders it easy for the assembly worker to access and install an electronic device.

Depending on the shape of an electronic device and external parts and components (the first fitting and the second fitting) thereof, the first platform 20 and the second platform 40 of the assembly auxiliary jigs 1, 2, 3 of the present invention are formed and fixed to the base 10, such that the assembly auxiliary jigs 1, 2, 3 can contain an electronic device and external parts and components (the first fitting and the second fitting) of different dimensions and shapes, such as the antenna 150 or the support stands 170, and can provide stable engagement. However, the aforesaid disclosure does not limit the assembly auxiliary jigs 1, 2, 3 of the present invention, as the base 10, the first platform 20, and the second platform 40 can also be integrally formed as a unitary structure.

In conclusion, an assembly auxiliary jig of the present invention has a receiving space for holding a casing firmly, a positioning groove for engaging with a first fitting, and a positioning recess for receiving a second fitting, so as to stabilize the operation of parts and components and prevent omission of parts and components. The assembly auxiliary jig of the present invention further has a first platform, a first lid, a second platform, and a second lid for ensuring the assembly status of the external parts and components of the casing so as to prevent the external parts and components from loosening during an assembly process. Furthermore, the assembly auxiliary jig of the present invention further has a protective pad for protecting the surfaces of the electronic device assembled by the assembly auxiliary jig of the present invention and enhancing the quality of the assembly process. Thus, compared with a conventional means of assembly, the assembly auxiliary jig of the present invention is quicker, more precise, and more convenient, enables an assembly process to be performed and finalized once and for all and in a "one worker one piece" manner, simplifies the operation of an assembly production line, and eventually enhances the conforming rate, quality, and yield of products.

The foregoing embodiments are provided to illustrate and disclose the technical features of the present invention so as to enable persons skilled in the art to understand the disclosure of the present invention and implement the present invention accordingly, and are not intended to be restrictive of the scope of the present invention. Hence, all equivalent modifications and replacements made to the foregoing embodiments without departing from the spirit and principles in the disclosure of the present invention should fall within the scope of the present invention as set forth in the appended claims. Accordingly, the protection for the present invention should be defined by the appended claims.

What is claimed is:
1. An assembly auxiliary jig for facilitating assembly of an electronic device having a casing, a first fitting, a second fitting, and a wire, the assembly auxiliary jig comprising:
   a base having therein a receiving space for positioning and receiving the casing and an accessing recess configured to communicate with the receiving space and facilitate access to the casing;
   a first platform disposed at the base and having a positioning groove in communication with the receiving space, wherein the positioning groove is configured to receive an exposed portion of the first fitting after the first fitting is disposed at the casing;
   a first lid hinged to the first platform and configured to close the positioning groove so as to ensure an assembly status of the first fitting;

a second platform disposed at the base and defined with a positioning recess in communication with the receiving space, wherein the positioning recess is configured to receive an exposed portion of the second fitting after the second fitting is disposed at the casing; and a second lid hinged to the second platform and configured to close the positioning recess so as to ensure an assembly status of the second fitting.

2. The assembly auxiliary jig of claim 1, wherein the first lid further comprises a securing groove corresponding in position to the positioning groove, such that the securing groove and the positioning groove together receive the first fitting as soon as the first lid closes the positioning groove.

3. The assembly auxiliary jig of claim 1, wherein the second lid further comprises a stopping block corresponding in position to the positioning recess, such that the stopping block abuts against the second fitting as soon as the second lid closes the positioning recess.

4. The assembly auxiliary jig of claim 1, wherein an engaging slit extends from and communicates with the receiving space of the base, such that the wire of the electronic device is fixed in place by means of the engaging slit.

5. The assembly auxiliary jig of claim 1, wherein the base comprises an additional accessing recess, such that the accessing recesses are disposed on two sides of the receiving space.

6. The assembly auxiliary jig of claim 1, wherein magnets adhere to the second platform and the second lid, respectively, such that the positioning recess is hermetically sealed by shutting the second lid against the second platform.

7. The assembly auxiliary jig of claim 1, wherein the second lid comprises a handle for use in operating the second lid to close the positioning recess.

8. The assembly auxiliary jig of claim 1, wherein the base, the first platform, and the second platform are integrally formed as a unitary structure.

9. The assembly auxiliary jig of claim 1, wherein a protective pad is disposed on electronic device-contact surfaces of the assembly auxiliary jig.

* * * * *